United States Patent [19]

Yoder

[11] 4,409,608

[45] Oct. 11, 1983

[54] RECESSED INTERDIGITATED INTEGRATED CAPACITOR

[75] Inventor: Max N. Yoder, Falls Church, Va.

[73] Assignee: The United States of America as represented by the Secretary of the Navy, Washington, D.C.

[21] Appl. No.: 258,345

[22] Filed: Apr. 28, 1981

[51] Int. Cl.³ ............... H01L 27/02; H01L 29/06; H01L 23/48; H01L 29/44

[52] U.S. Cl. .................................. 357/51; 357/14; 357/15; 357/22; 357/55; 357/68

[58] Field of Search ............ 357/14, 15, 22, 51, 357/55, 68

[56] References Cited

U.S. PATENT DOCUMENTS

| | | | |
|---|---|---|---|
| 3,565,807 | 2/1971 | Siverisen et al. | 357/91 X |
| 3,962,713 | 6/1976 | Kendall et al. | 357/51 X |
| 4,156,249 | 5/1979 | Koo | 357/51 |
| 4,249,196 | 2/1981 | Durney et al. | 357/51 X |

OTHER PUBLICATIONS

Arzubi et al., *IBM Technical Disclosure Bulletin*, vol. 17, No. 6, pp. 1569-1570, Nov. 1974.

Primary Examiner—Andrew J. James
Assistant Examiner—Seth Nehrbass

[57] ABSTRACT

A large value capacitor having interdigitated electrodes embedded within a planar substrate of semiconductor material and a method for producing the capacitor are presented. Metallic material forming a plurality of individual electrodes is deposited within a plurality of isolated parallel spaced-apart planar recesses formed into the substrate from the planar surface by ion beam machining, etching, or the like. Alternate individual electrodes are electrically interconnected to form the interdigitated opposite electrodes of the capacitor with the dielectric comprising the high resistivity substrate material. Each of the interdigitated electrodes is connectable to other electronic members including members disposed on the same substrate.

3 Claims, 4 Drawing Figures

RECESSED INTERDIGITATED INTEGRATED CAPACITOR

BACKGROUND OF THE INVENTION

The present invention relates to capacitors and more particularly, to large value integrated circuit capacitors embedded within a substrate and connectable to other electronic components.

In the microwave frequency spectrum, small and medium power solid state amplifier circuits are increasingly gaining prominance due to the longer life, smaller size and lower power consumption of the solid state devices. A common arrangement is for solid state devices, e.g. discrete gallium arsenide (GaAs) Schottky barrier gate field effect transistors (FETs) which are mounted on an insulating substrate, to be interconnected with discrete inductors, resistors, capacitors, and transmission lines. However, increased gain-bandwidth product and lower manufacturing costs accrue by further integrating these microwave discrete devices into monolithic devices wholly fabricated on gallium arsenide or other suitable semiconductor material. Examples in the prior art of production of integrated circuit passive devices is shown in U.S. Pat. Nos. 3,387,286, 3,745,430 and 3,138,744 for integrated circuit capacitors, 3,390,012 for integrated circuit capacitors and inductors produced on a substrate of yttrium iron garnet, and 4,065,742 for integrated circuit resistors.

Because of its superior high frequency capability, gallium arsenide is the preferred semiconductor material for microwave devices; however, on GaAs chips, space is particularly at a premium. At microwave frequencies, the optimum input impedance of medium power FETs is usually low, e.g. less than five ohms, thereby necessitating comparatively large interconnecting capacitors, e.g. more than five picofarads (pf). Integrated circuit capacitors as shown in the above cited patents having silicon dioxide ($SiO_2$) or aluminum dioxide dielectrics must be at least 2500A° thick to avoid pin hole short circuits between plates and have a production yield of 96 percent or better. Since the larger the distance between the capacitor electrodes the lower the capacitance value, a larger area on the chip for larger plate area is required to achieve the required capacitance value. A 5 pf capacitor of silicon dioxide dielectric requires a chip area of 0.016 mm$^2$ (25 mil$^2$) which is comparatively large. Additionally, the silicon dioxide dielectric is typically obtained by oxidation of silane at 390° C. which places severe constraints on the processing cycle of the GaAs wafer at 390° C. which is above the eutectic point of several of the metallizations required on the chip. RF sputtering of the $SiO_2$ dielectric creates even higher temperatures. Room temperature anodization of aluminum or tantalum metal capacitor electrodes at 120 volts in a 3 percent tartic acid solution with a PH of 5.5 is a marginal process since there is still a considerable problem with pinhole short circuits between the electrodes.

U.S. Pat. No. 4,156,249 to Koo shows an interdigitated capacitor on a substrate surface but requires a large area to develop a large value of capacitance as discussed above. U.S. Pat. No. 3,962,713 to Kendall et al, while increasing the capacitance value per area, requires a highly doped, low resistivity substrate which requires a separate diffusion for the substrate to achieve this low resistivity, requires one plate of the produced capacitor because of the low substrate resistivity to be connected to ground thereby preventing its use as an input capacitor, and requires that the dielectric be deposited in a separate step as the substrate material cannot be used as an insulating dielectric due to the low resistivity, said deposited dielecric also being subject to the deficiencies discussed above. Thus, the capacitor of Kendall et al does not meet the present requirements.

U.S. Pat. No. 3,565,807 to Severisen et al shows a capacitor with plates formed in an insulating material such as aluminum oxide in the form of sapphire. An insulating substrate would require a number of deposition and diffusion steps for providing other hybrid components such as transistors on the same substrate. Additionally, the thermal conductivity of sapphire requires application of substantial localized power when burning out the grooves by the electron beam thereby causing the immediate substrate material to be damaged. Additionally, according to Severisen et al, 2.54 $\mu m$ is the minimum spacing that can be achieved between plates of the capacitor and such a capacitor would require a substantially larger amount of chip area for the value of capacitance of the present requirement, i.e. 5 pf. Such a 5 pf capacitor would require such a large area that when used at microwave frequencies, the capacitor may exhibit transit time effects, i.e. the time required for the electrical wave to traverse the capacitor would be a substantial percentage of the wave period.

Accordingly, it is desirable to produce a high value integrated circuit capacitor using a minimum chip area wherein the capacitor is substantially immune to pin hole short circuits in production and has a correspondingly high production yield. It is further desirable to produce a high value integrated circuit capacitor which requires a minimum of diffusion and depositing steps and is disposed on a high resistivity semiconductor substrate material to isolate the capacitor from other components thereby permitting both plates of the capacitor to be connected as desired to provide flexibility of wiring the capacitor into a circuit.

OBJECTS OF THE INVENTION

Accordingly, it is an object of the present invention to provide a high value integrated circuit capacitor using a minimum of chip area and requiring a minimum of diffusion and depositing steps.

Another object of the present invention is to provide a high value integrated circuit capacitor disposed on a high resistivity semiconductor substrate material to isolate the capacitor from other components thereby permitting both plates of the capacitor to be connected as desired and especially as a series blocking capacitor connected to other electronic components embedded in the same substrate.

A further object of the present invention is to provide a high value integrated circuit capacitor and method for producing same wherein interdigitated plates of the capacitor are disposed within recesses in the body of the insulating substrate, the plates being formed by metallic material deposited within the recesses such that the dielectric of the capacitor comprises the high resistivity semiconductor substrate material.

Other objects, advantages and novel features of the invention will become apparent from the detailed description of the invention and when such objects fall within the spirit of the present disclosure, they are to be construed as falling within the scope of the appended claims.

SUMMARY OF THE INVENTION

Briefly, the present invention includes a microelectronic capacitor having interdigitated electrodes embedded within a substrate. A plurality of recesses are formed in a high resistivity semiconductor substrate material by particle beam machining, etching, or the like and the recesses are substantially filled with a conductive material, e.g. aluminum, forming a plurality of individual electrodes. Alternate ones of the electrodes are interconnected forming the interdigitated plates of the capacitor with the dielectric comprising the insulating substrate material. The capacitor thus formed provides a high value of capacity with reduced chip area and both of the capacitor plates can be connected to other electronic components as desired including other electronic components disposed or embedded on the same substrate.

BRIEF DESCRIPTION OF THE DRAWINGS

The present invention may best be understood by reference to the following detailed description when read in conjunction with the accompanying drawings wherein.

DETAILED DESCRIPTION OF THE PREFERRED EMBODIMENT

Figure 1:
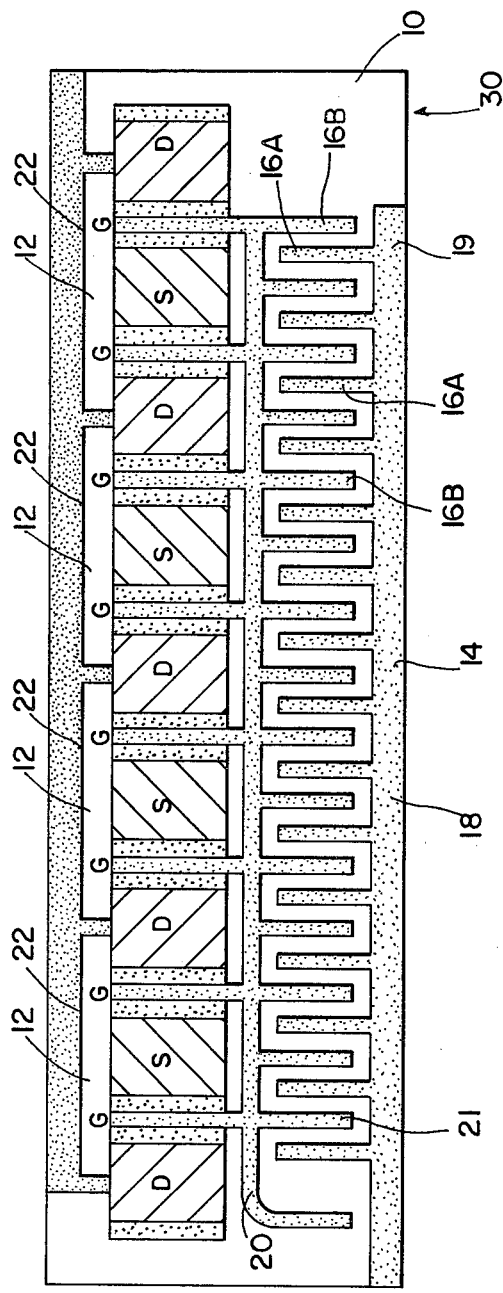
FIG. 1 is a diagrammatic top view of an integrated circuit having a high value input capacitor of the present invention.

Referring now to the drawings wherein like members are given like numerical designations, there is shown in FIG. 1 a top view of an integrated circuit comprising the present invention. The substrate 10 is provided with a plurality of field effect transistors (FETs) 12 integral with the substrate 10 and a high value integrated circuit capacitor 14 having interdigitated plates or electrodes 16 A,B embedded within the substrate 10.

More particularly, the substrate 10 of the present embodiment comprises a planar chip of gallium arsenide (GaAs) or indium phosphide (InP). These substrate materials typically have an intrinsically high resistivity of $10^9$ ohm-centimeter in contrast to silicon which normally is limited to $10^4$ ohm-centimeter. Additionally, GaAs has an $\epsilon$ of 12 whereas $SiO_2$ has an $\epsilon$ of 3.8 thereby permitting a capacitor with GaAs as a dielectric to be smaller than a capacitor of same capacitance having $SiO_2$ as a dielectric. Thus it is seen that GaAs is better suited for use as a dielectric for a capacitor, since it is highly desirable that the $\epsilon$ of the dielectric be as high as possible and that the resistivity of the dielectric of a capacitor be high. With current technology, a resistivity of $10^4$ ohm-centimeters is acceptable for a substrate dielectric of a bypass capacitor, however, if the capacitor is to be used as a blocking capacitor, at least $10^7$ ohm-centimeters is preferred. Thus, the present invention, though specifically discussing GaAs, is likewise applicable to any semiconductor substrate material including silicon having the required resistivity properties.

The capacitor 14 in the exemplary embodiment is an input capacitor for the transistors 12. The plurality of individual plates 16A are interconnected by conductive strip 18 to form one plate 19 of the capacitor 14. The plurality of individual plates 16B are interconnected by conductive lead or strip 20 to form the other plate 21 of the capacitor with the individual plates 16A,B being interdigitated to increase the effective plate area between the respective plates thereby increasing the capacitance of the device. Both of the leads 18 and 20 can be connected to other devices, however, in the present embodiment the lead 20 is connected to each of the gates 22 of the respective transistors 12 with the bias for the transistors being appliable to the lead 20. The field effect transistors are produced by ion implantation onto the insulated substrate in a manner known in the art, however, the FETS can be produced in any other way compatible with the device.

Figure 2:
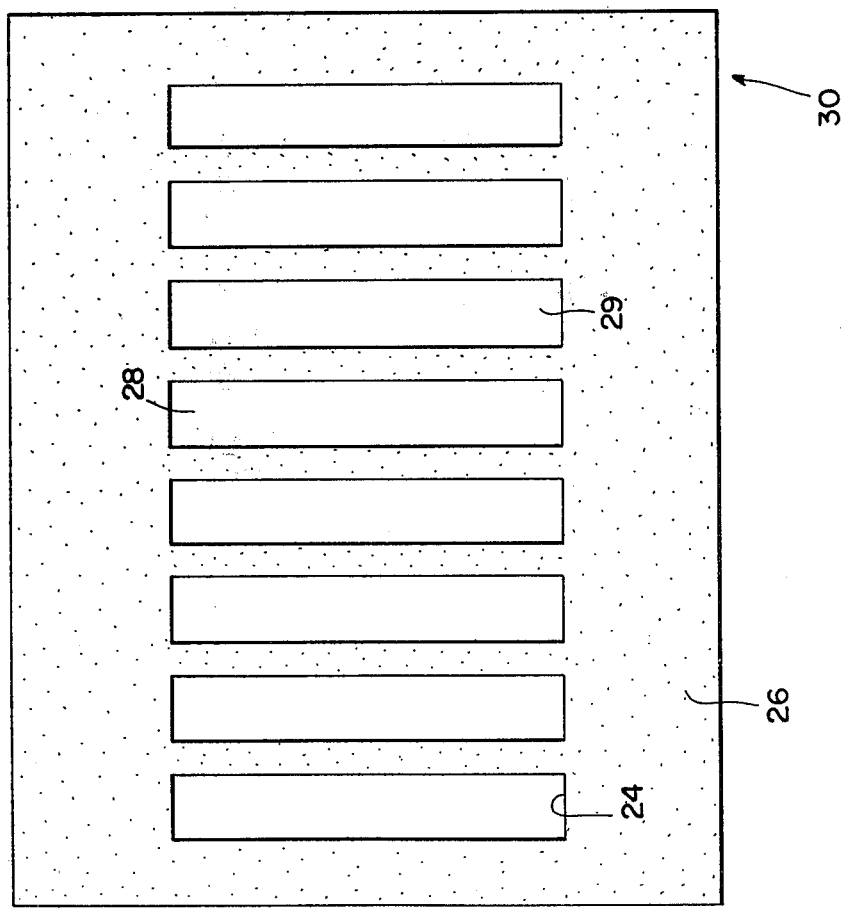
FIG. 2 is a resist pattern used in making the capacitor of the present invention.

Referring now to FIG. 2, the individual capacitor plates 16A,B are produced by machining out or otherwise removing material from the substrate 10 by etching or the like to form recesses 24. In the present embodiment, the recesses are fabricated by depositing onto the chip surface a resist pattern 26 forming a plurality of rectangular openings 28. The resist pattern 26 can be deposited by photolithographic or electron beam lithographic techniques. The resist can be comprise polymethylmethacrolate (PMMA) for electron beam curing exposure or Shipley 1350J made by Shipley Company of Newton Massachusetts or similar resists for optical exposure. The resist material is uniformly spun to a thickness of 7000A° to 8000A°.

The openings 28 are rectangular areas of dimensions of 5 micrometers ($\mu$m) long by 1 $\mu$m wide separated from each other by 0.5 $\mu$m. The width is not critical, however, the capacitor for a given value of capacitance can be physically reduced by narrowing the width. Additionally, narrowing the separation distance not only reduces the physical size of the capacitor but also increases the capacitance as well. A separation of 0.5 $\mu$m is about the best that can be expected of photolithography while with electron beam lithography separations of 0.25 $\mu$m or less can be achieved.

The substrate material within the open rectangular areas 28 is then removed or machined away forming recesses 29. The recesses 29 are isolated from and substantially parallel to each other extending into the substrate 10 perpendicular to the top surface 30. In the present embodiment an ion or plasma beam is used to machine away the GaAs wherein the rate of open area machining is 10 times faster than that of the resist pattern. Material removal is typically accomplished to a depth of three $\mu$m, however, the depth to width aspect ratios greater than 5:1 are obtainable in this manner.

It is within the contemplation of the present invention that the recesses can be produced using a chemical etch with an appropriate resist. It is further within the contemplation of the present invention that an appropriately precisely controllable ion beam can be used to machine out the required recesses without the use of a resist.

The plurality of recesses is then substantially filled with a conducting substance, e.g. aluminum. These metallized regions form the plates 16A,B of the capacitor while the undisturbed semi-insulating semiconductor substrate material forms the dielectric layers of the capacitor.

Figure 3:
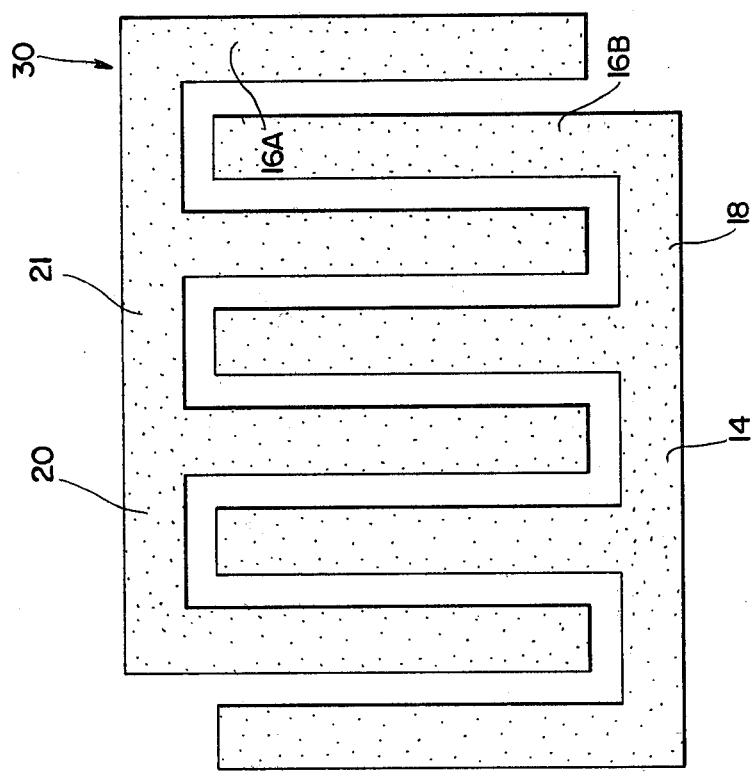
FIG. 3 is a view of the top surface of a completed capacitor of the present invention embedded within a substrate.

After the capacitor plates 16A,B are formed, the resist pattern is then removed and the alternate plates of the capacitor are interconnected by conductive strips 18, 20 forming the two interdigitated plates 19, 21 of the capacitor. This interconnection is accomplished by a second resist pattern and the photo or electron beam lithography with appropriate metalization. The surface of the completed capacitor is shown in FIG. 3.

It is within the contemplation of the present invention that if the first resist pattern is used, the interconnection between the individual plates of the capacitor to form the interdigitated plates can be performed at the same time that the recesses are metalized thereby negating the need to deposit a second resist. This can be accomplished if the first resist pattern makes provision for such metalization. If however the machining out or removal of material without a mask is used then a resist pattern should be deposited prior to any metalization.

Figure 4:
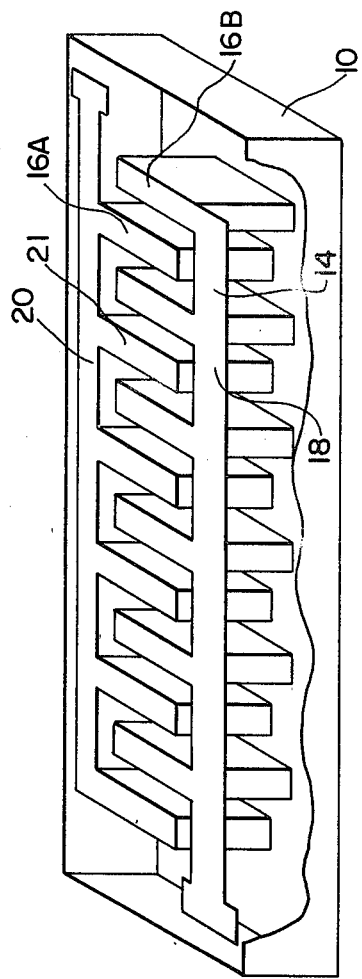
FIG. 4 is an isometric view of the capacitor of the present invention embedded in a substrate with a portion of the substrate cut-away.

The completed capacitor with the interdigitated electrodes embedded within the substrate is shown in FIG. 4. The respective plates can then be connected to electrical components external of the substrate or to electrical components such as transistors, capacitors and resistors formed monolithically on the same substrate as shown in FIG. 1.

The interdigitated device may then be further improved by pacifying and encapsulating the metalized surface with silicon dioxide or silicon nitride to protect the device from contamination.

Thus, there has been disclosed a microelectronic capacitor having interdigitated electrodes embedded within a substrate. A plurality of recesses are formed in a high resistivity semiconductor substrate material by beam machining, etching or the like and the recesses are substantially filled with a conductive material forming a plurality of individual electrodes of the capacitor. Alternate ones of the electrodes are interconnected forming the interdigitated plates of the capacitor with the dielectric comprising the insulating substrate material. The interdigitated plates provide high capacitance for a relatively small chip area and the plates of the capacitor are connectable in series or parallel to other monolithically electronic components made on the same substrate.

Obviously, many modifications and variations of the present invention are possible in view of the above teachings. It is therefore to be understood that within the scope of the appended claims the invention may be practiced otherwise than as specifically described.

What is claimed is:

1. An integrated circuit comprising:
   a semiconductor substrate having first and second spaced apart surfaces and a resistivity of the material of the substrate being greater than $10^4$ ohm-centimeters;
   a first plurality of spaced apart electrodes embedded within the bulk of the substrate between the first and second surfaces;
   a second plurality of spaced apart electrodes embedded within the bulk of the substrate between the first and second surfaces, the ones of the first electrodes alternating with the ones of the second electrodes along the plane of the substrate;
   at least one electronic member formed within the substrate;
   means interconnecting the first plurality of electrodes and the electronic member and disposed proximal the first surface; and
   means interconnecting the second plurality of electrodes and disposed proximal the first surface;
   the first and second plurality of electrodes being metallized members forming interdigited opposite electrodes of a capacitor with a dielectric thereof being the substrate material.

2. The integrated circuit of claim 1 wherein the means connecting the first plurality of electrodes comprises metallized conductors.

3. The integrated circuit of claim 1 wherein the means connecting the second multiplicity of electrodes comprises metallized conductors.

* * * * *